United States Patent [19]

Piliavin et al.

[11] 4,363,029
[45] Dec. 7, 1982

[54] SWITCH FOR SENSING PROXIMITY OF AN OPERATOR

[75] Inventors: Michael A. Piliavin, Plano; James R. Toker, Dallas, both of Tex.

[73] Assignee: Texas Instruments Incorporated, Dallas, Tex.

[21] Appl. No.: 207,584

[22] Filed: Nov. 17, 1980

[51] Int. Cl.³ ............................................. G02F 1/13
[52] U.S. Cl. .................................. 340/501; 340/686;
340/706; 340/713; 340/784
[58] Field of Search ............... 340/500, 501, 562, 593,
340/686, 700, 706, 711, 713, 714, 758, 765, 771,
784

[56] References Cited

U.S. PATENT DOCUMENTS

| 3,716,289 | 2/1973 | Creagh et al. | 350/160 |
| 3,765,747 | 10/1973 | Pankratz et al. | 350/160 LC |
| 3,771,855 | 11/1973 | Burns | 340/765 |
| 4,224,615 | 9/1980 | Penz | 340/712 |

Primary Examiner—Alvin H. Waring
Attorney, Agent, or Firm—Robert O. Groover, III; Melvin Sharp; James T. Comfort

[57] ABSTRACT

A proximity switch in which the electronic characteristics of a liquid crystal display are monitored relative to a reference liquid crystal display to determine when an operator has come into proximity thereto. A controller monitors the display elements, liquid crystal displays, respective capacitances or inductance and when an operator comes into proximity to an electrode in the display element, the controller senses this proximity due to the change in capacitance or inductance of the element. This sensing allows the controller to recognize when a change of state is desired by the operator. The use of the reference element allows the controller to respond only to operator proximity and not to noise caused by changes in the environment, such as temperature.

17 Claims, 7 Drawing Figures

Fig.3a(con't.)

SWITCH FOR SENSING PROXIMITY OF AN OPERATOR

BACKGROUND OF THE INVENTION

This invention relates to displays and more particularly to displays which allow a switching action at the display itself due to the proximity of an operator thereto.

Electrical circuits intrinsically require a switching mechanism to be utilized to direct and alter the flow of data and power. This switching was generally accomplished by a mechanical switch which physically closed or shorted two leads. Recently, a new form of switching has taken place in which the switch itself does not actually do the shorting. In this process a relay switch is activated when the control means receives data indicating that the operator desires a change in the state of operation. Hence, the control means monitors some physical characteristic which is reflective of the operator's actions. This type of switch is generally referred to as a touch switch.

One form of the touch switch involves mechanical movement achieved by forming a conductive touch pad on one surface of a glass panel, and forming a pair of spaced apart conductors on the opposite surface of the glass panel in registry with the touch pads on the one surface. Electrical contact to the spaced apart conductors on the opposite surface of the glass panel requires the use of a complex arrangement of spring contact members affixed to the circuit board or the like. The circuit board is mounted so it is held in registry with a glass panel and the spring contact members make electrical contact with the corresponding ones on the conductor on the opposite surface of the glass panel. When the operator touches and presses on the glass panel it deforms and allows the pads to contact. The control means monitoring this shorting between the pads will utilize this to effectuate a change from state-to-state.

This arrangement though, is complex, relatively expensive to manufacture, and generally requires the assembly to be extremely thick. This thickness may be great enough to accommodate the glass panel, spring contact memory and circuit board on which the spring contact members are mounted. Additionally, this type of switch must be mounted near or in natural association to be independent display or permanent label so that the operator will readily recognize the function which the switch serves.

Another form of the touch switch is referred to as capacitive touch switch. In this form of the touch switch, a touch electrode is placed in such a position that an operator may come in physical contact to allow the natural human capacitance of approximately 100 pico farads (pf) to be communicated to the touch electrode. A pair of secondary electrodes are placed in capacitive communication to the touch electrode. A monitored source signal is communicated to the first of the secondary electrodes which is then capacitively communicated to the last secondary electrode via the touch electrode. By monitoring the capacitance sensed in the last secondary electrode, a control means determines when an operator has touched the primary electrode. The capacitance in the secondary electrode will be altered by the natural human capacitance of approximately 100 pf communicated to the touch electrode by the operator's touch.

Again though, this switch must be matched to a label to communicate to the operator the purpose for which it serves. Additionally, the operator must touch the panel; and, if poor conduction occurs between the operator and the touch electrode, the control means will have difficulty determining if the operator has touched or contacted to touch electrode.

The art of labeling a switch has become very extensive. Numerous means have been developed, in which a label may be applied to a switch.

Labels may be permanent in nature, being affixed to or near the switch. Paint, ink or the like is typically used.

An alternative method to labeling permanently is to label via some sort of alterable display. These displays are typically Liquid Crystal Displays (LCD's), Light Emitting Diodes (LED's), Gas Discharge Displays, or other such means.

Construction of these displays is well known and well documented in the art. Liquid Crystal Displays and their construction is well documented in the U.S. Pat. No. 3,771,855, issued Nov. 13, 1973, to Carmen Burns, incorporated hereinto by reference.

Another method which to utilizes a liquid crystal display as an input device is that of U.S. Pat. No. 4,224,615 issued Sept. 23, 1980, to Penz. In this switch, the operator must contact and depress the front panel of the liquid crystal display. This deformation causes a change in the capacitance which is monitorable.

Typically, in an operator interface, a switch and a display are matched to each other so that the display communicates to the operator a label for the switch. Note though, that two sets of circuitry are required in this arrangement, one for the display and one for the switch. The display and the switch remain separate units. Another hinderance to this arrangement of switch and display, which form an interface, is that the operator must come in physical contact with the switch. The switch is typically separated in space from the display. Hence, the operator must determine which switch is associated with which of the display.

DESCRIPTION OF THE INVENTION

It has long been recognized that the human body does not act as a neutral electrical apparatus but has a natural human capacitance, electrical conductivity, and other intrinsic electrical attributes. These electrical attributes have been utilized by prior switches so that the touching or the pressure from the human body may be either mechanically sensed or capacitively sensed by some control means.

Throughout this disclosure and discussion herein, the use of the term "element" refers to a display element which includes an electrode. This electrode must be capacitively couplable to an operator. Typically, this electrode is positioned on the front panel of the display itself. One such segment is a liquid crystal cell or segment or an electro luminescent display.

A reference element is established in parallel to the display element in a position so that when the operator comes into capacitive communication with the display element, the operator is not in significant capacitive communication with the reference element. Hence, the operator's presence or proximity affects the display element more than the reference element. The display or active element is the element which communicates information to the operator. As the operator, whether through his body or electrically conductive appendage thereto, comes into close enough proximity to the display element to capacitively couple thereto, the capacitance of the display element is measurably altered or changed. This alteration or change is sensed by the control means.

Since in normal operation this change may be the resultant of a change in the environmental conditions, such as a temperature change, the control means compares the signal received from the display element to the signal received from the reference element. Since the reference element is subjected to the same environmental impact as the display element, the control means is capable of comparing the signals from each element to determine if the change in capacitance or inductance is due to the proximity or is due to environmental changes. Should the change be due to operator proximity, a change of state will occur in the control means which will be capitilized upon in affecting a change in operation of either a slave unit or to the display element itself.

The change of state of the control means is the switching mechanism. As this state changes, the operation of some remote slaved unit, such as a separate display or some mechanical operation, or the display element itself, is altered to a new operation. In this fashion, the operator comes into proximity to the label actually seen without having to mentally ascertain which switch should be activated to effectuate a change in operation as indicated by the label on the display element. Note that the display element itself provides both the display means, and a switching mechanism for the operator, thereby producing an operator interface having greater versatility and utility.

In more detail, the invention involves placing the display element and the reference element such that when the operator comes in proximity to the display element he does not cause an equivalent change in the reference element. This involves placing a reference element in a location removed either physically or electrically from the display element. Preferably, though, the reference element and the display element are subjected to the same environmental impact so that their resulting signals may be accurately compared.

By way of example, should the reference element be placed thermally isolated from the display element, a change in temperature in the display segment will induce a change in its signal which will not be properly reflected in the reference element, this difference will create a noise situation and cause the controller to change its state incorrectly. The closer the environmental conditions to which the display element and reference element are subjected, the lower the noise level will be.

Preferably the element is a liquid crystal display. The construction of liquid crystal displays was well described in U.S. Pat. No. 3,771,855 issued Nov. 13, 1973 to Burns; and U.S. Pat. No. 3,716,289 issued Feb. 13, 1973 to Creagh et al., both of which are incorporated hereinto by reference.

The controller, which is connected to both the display element and the reference element, compares the signals therefrom. In its comparison, the controller, control means, will either do an absolute comparison on the signals or a comparison of the signals relative to a predetermined threshold level. In a threshold level situation, the controller changes states only when the difference between the signal received from the display element and the signal received from the reference element passes some threshold level. This threshold level method helps reduce incorrect state changes due to noise caused by external electrical activity. The threshold value provides a buffer for a change in state. The section of the threshold value is controlling for determining the actual distance or proximity to which the operator must come relative to the display element before the proximity will cause a change in state.

The controller additionally, operates a display driver which produces the appropriate signal to activate the elements, the display element and the reference element. Display drivers are well known in the art and includes such techniques as multiplexing and the like. One example of the element which may be used in this invention is a liquid crystal display (LCD); an LCD requires an alternating current to produce a consistent and reliable contrast ratio. This alternating current is typically supplied through a half-duty, third-duty, or fourth-duty multiplexing scheme. Multiplexing schemes are well documented and described by Jacques Robert and Bruno Dargent in "Multiplexing Techniques for Liquid Crystal Displays" appearing in IEEE *Transactions on Electron Devices* of June 1977, pp 694–697, incorporated hereinto by reference.

LCD's and their associated drivers is described by the U.S. Pat. No. 3,765,747, issued Oct. 16, 1973 to Pankratz et al.; this patent is incorporated hereinto by reference.

The change of state which occurs in the controller acts as the switching action and effects the operation of the display element or a slaved unit. The actual display element, at a change in state of the controller, typically changes its labeling to communicate a new label. A slaved unit uses the change of state in the controller to change its own state appropriately.

The slave unit may be any device with which the controller may communicate. As example only, one such device for a slave unit is the automatic transmission of an automobile. In a typical operation, the display element and the reference element are physically mounted on the automobile dash board. The display element would illustrate the various modes of operations for the automatic transmission, (e.g. reverse, park, neutral, drive, etc.). As the operator comes in the proximity of one of these displays, say reverse, the automatic transmission will then change gears to this state.

Alternatively, the change of state in the controller may alter the operation of the display element itself, as example, electronic or digital watches. The operator, when he wants to view the month and day, would pass his finger in proximity to the display. This proximity is sensed by the controller and the display element changes from illustrating the hour and minute to illustrating the month and day. To change back the operator again passes his finger in proximity to the display element, which causes a change back to the month and hour. Note, since the need for mechanical switches is completely alleviated, except for the opening for the battery in the watch, the entire watch may be hermetically sealed so that moisture or other contaminants may not enter the internal electrical workings. This added protection will create a more secure and more reliable product.

Additionally, as the number of mechanical elements is reduced, and as the number of electrical components is reduced, the cost of the device will be significantly reduced. Since the invention herein, utilizes the display both as a communicative means and as a switching means, it may be used to reduce the complexity of numerous other devices which utilize switches allowing them to become less expensive and more reliable. Additionally, the need for moveable parts associated with switching is completely alleviated, allowing the system to be sealed to reduce the possibility of contaminants entering the electrical workings.

The invention, together with its operation and various embodiments, will be further described and illustrated by the following drawings.

BRIEF DESCRIPTION OF THE DRAWINGS

FIG. 3b is the timing diagram relating to FIG. 3a.

DETAILED DESCRIPTION OF THE DRAWINGS

Figure 1:
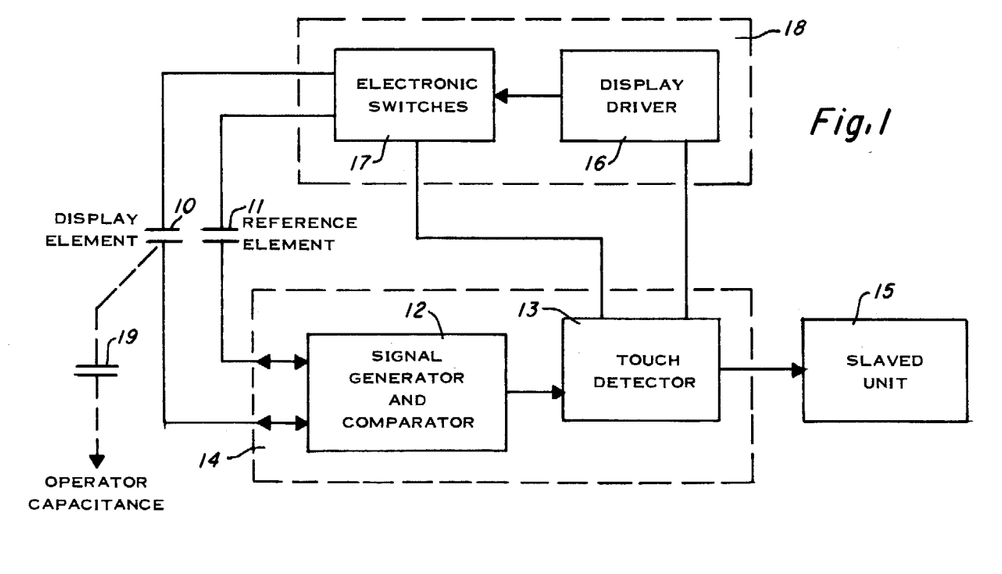
FIG. 1 is a functional schematic of the invention.

In FIG. 1, the display element 10 and reference element 11 communicate with a signal generator and comparator 12. The signal generator and comparitor 12 generates the signals communicated to the elements 10 and 11 as well as monitoring the physical characteristic, capacitance or inductance, used to determine operator proximity. The signal generator 12 communicates the difference in the physical characteristics to the touch detector 13. The touch detector 13 determines if an operator has come in the proximity of the display element 10 causing a capacitance 19 to be communicated thereto. Should an operator be in proximity to the display element 10, touch detector 13 communicates the appropriate signals to a slave unit 15, the display driver 16, and appropriate electronic switches 17, indicating that a change in state has occured.

The monitoring of the display element 10 and reference element 11 via the control means 14, as well as the operation through the operation means 18 is readily incorporatable onto one control means such as a TMS 9900 commercially available from Texas Instruments.

The display element 10 and the reference element 11 are preferably liquid crystal displays. Liquid crystal displays (LCDs) have the required physical construction necessary for the invention to operate. This construction involves having an electrode in such a position that it may be capacitively coupled to an operator. Additionally, a liquid crystal display exhibits capacitive characteristics in its operation. That is, during operation, the LCD has an intrinsic capacitance within the element. These characteristics make it more acceptable to monitoring via the controller 14.

The slaved unit 15 is any unit which receives its operational instructions from the controller 14. As discussed earlier, the slaved unit 15 may be a mechanical device, such as an automatic transmission, or may be electrical in nature, such as a central processing unit or computer. As noted in the schematic, a touch detector 13 communicates to the display driver 16. This communication allows the display element 10 to be altered whenever an operator comes into the proximity of it. In this fashion the display element's informational content may be altered to communicate a new set of information to the operator.

Figure 2:
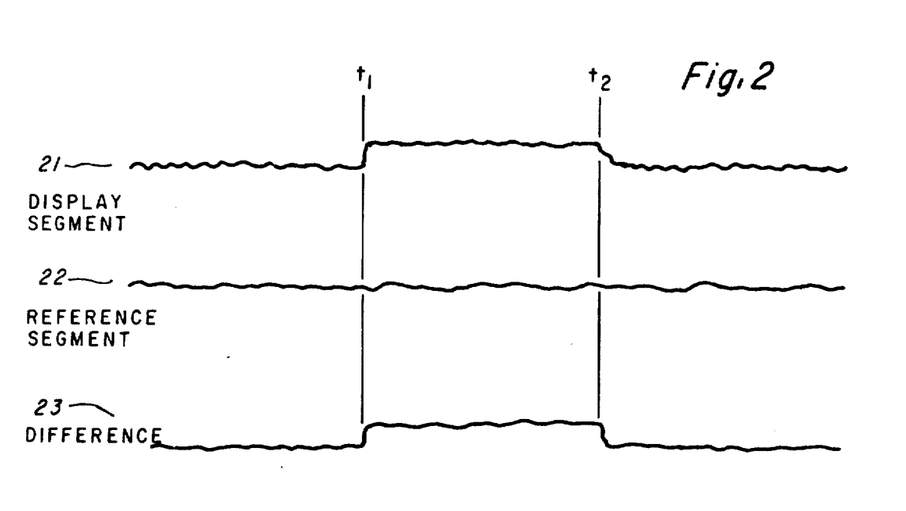
FIG. 2 is a capacitive sense diagram illustrating the change which will be observed between the display element and the reference element during operation.

The actual signals which are to be sensed and which are controlling upon the operation, are illustrated in FIG. 2. A particular display element 21 has a given capacitance until time $t_1$ at which time an operator comes into proximity thereto. Note that this capacitance is not constant but varies slightly in relation to time due to temperature and other environmental changes.

The operator remains in proximity to the display element for some finite amount of time, $t_1$ to $t_2$, after which time the capacitance returns to normal. The reference element 22, is unaffected at time $t_1$ and $t_2$ since it is relatively independent of the influence created by the proximity of the operator. The controller, not shown, compares the difference between the signal of display element 21 and the signal of reference element 22, thereby, deriving the difference diagram 23.

Note that the difference 23 before time $t_1$ is approximately zero indicating that the operator is not in the proximity of the display element. Between time $t_1$ and $t_2$ through, a difference is sensed by the controller. At time $t_2$ when the operator's proximity is removed, the difference 23 again returns to approximately zero. Hence; the change of state by the controller occurs only on the up-threshold, in this example time $t_1$, and not during the down-threshold or return to normal at $t_2$.

Since typically the controller operates at a much faster rate than the operator may enter and exit from the proximity of the display element, this characteristic of changing states only on the up-threshold, time $t_1$, may be maintained. Alternatively though, the controller may be designed to change states and remain in a secondary state only so long as the operator is in the proximity of the display element. One such example where this type of operation would be used is the change of states in a digital watch to illustrate the month and day only so long as the operator has his finger over the display or in proximity of the display element.

Figure 3A:
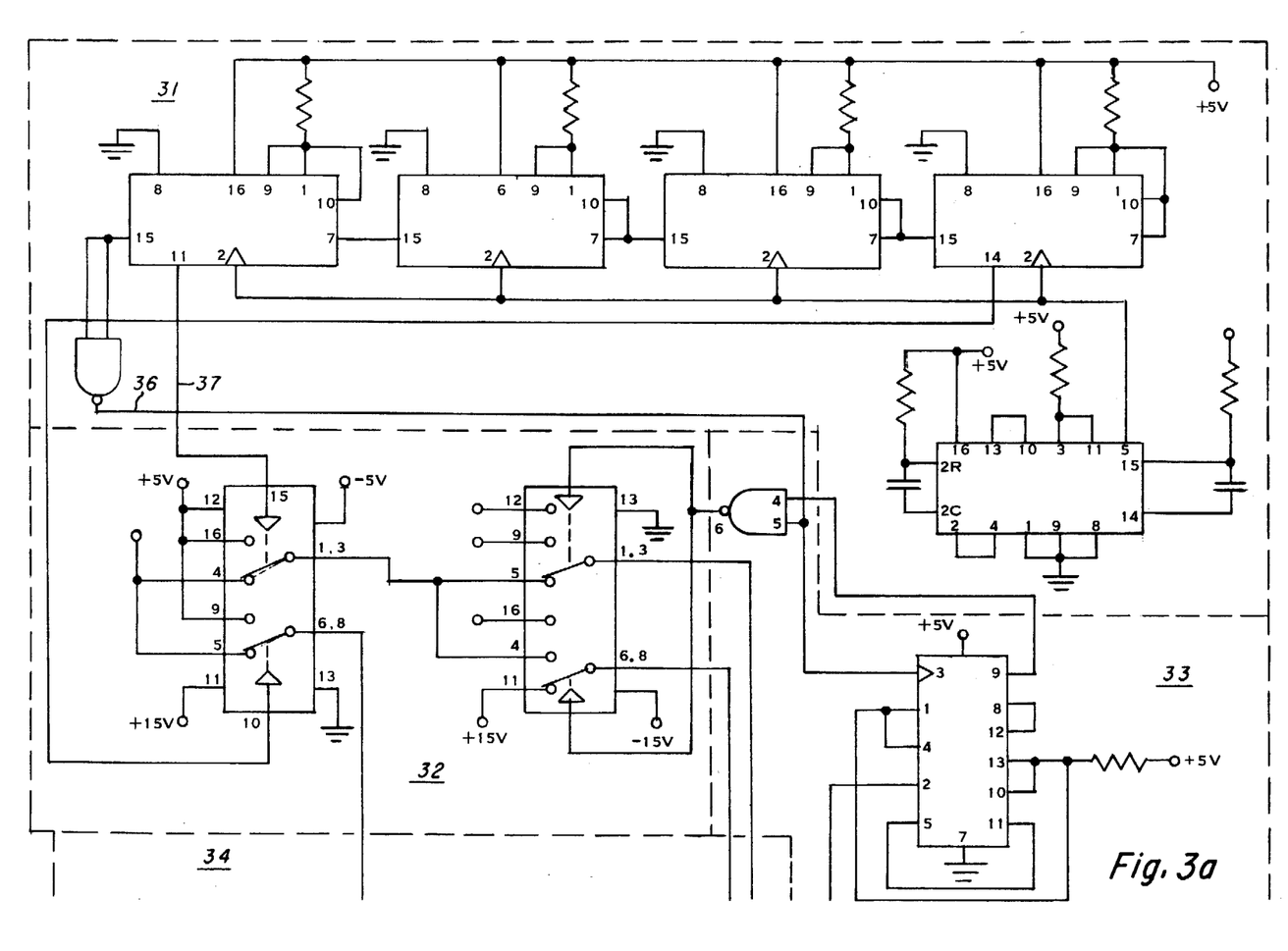
FIG. 3a is electrical schematic of an embodiment which will sense the proximity of the operator to the display element and change the element.

FIG. 3a is an electrical schematic of an embodiment of the invention in which the proximity of an operator to the elements, as illustrated LCD cells, causes a change in the state of the elements themselves.

The clocking 31 communicates with the driver 32 and the detector 33. This clocking 31 provides to the driver 32 a signal via the lead 37; this signal is characterized in FIG. 3b as 37'. The clocking 31 communicates to the proximity switch 33 a signal via lead 36 providing a signal 36' illustrated in FIG. 3b.

Figure 3B:
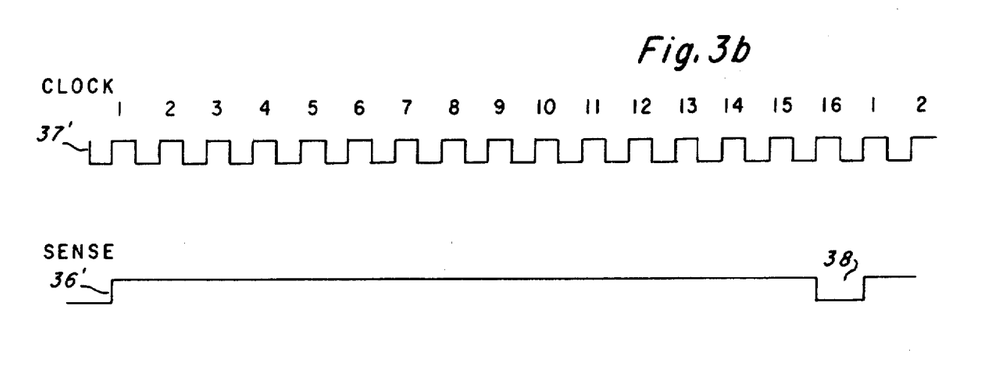

Note that the sense signal 36' goes into its operational phase, 38, only for one period during which time the elements will not be activated. In this fashion, the electrodes on the liquid crystal displays 34 communicates to the proximity switch 35.

In this embodiment of the invention, the liquid crystal cells 34 change state upon the proximity of an operator thereto. Hence, the LCDs 34 change from opaque to transparent and vice-versa upon an operator passing his finger into the proximity of the liquid crystal cells 34. The operator may, but needs not, contact the liquid crystal cells 34.

Figure 4:
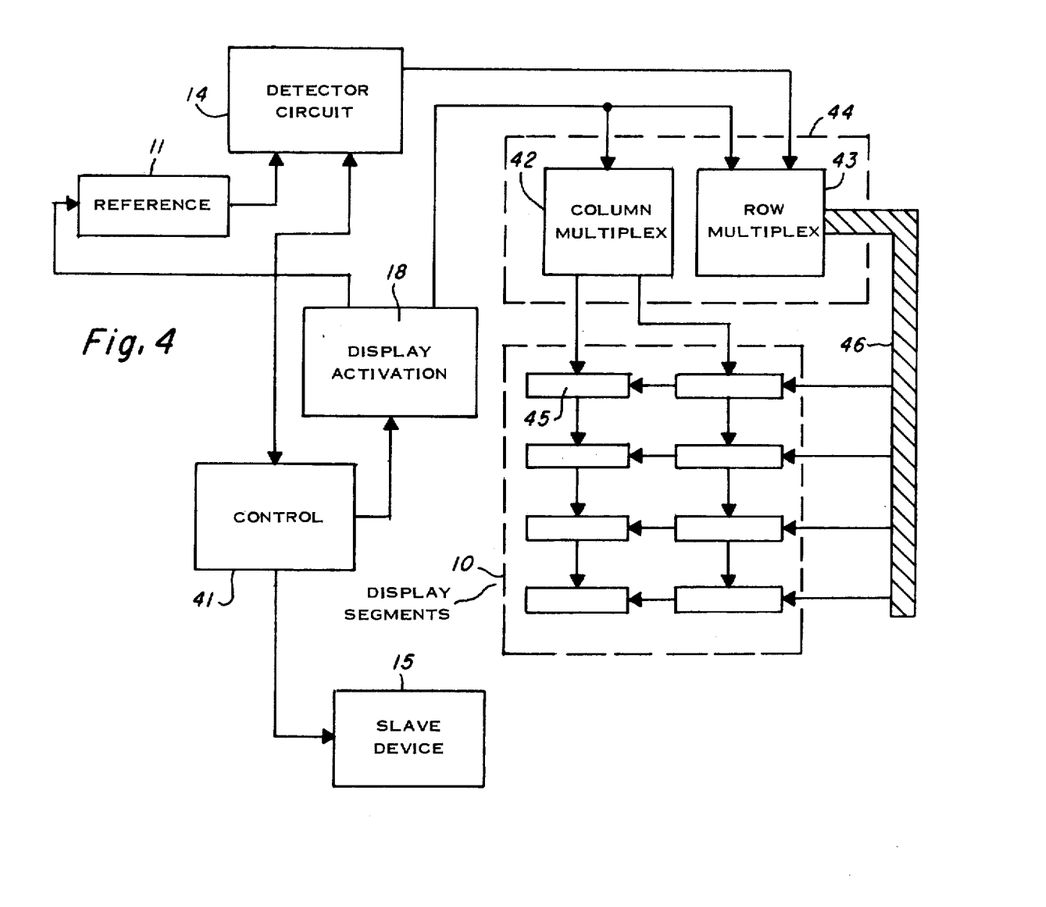
FIG. 4 is a functional schematic of an embodiment of the invention wherein a single reference element is used to compare to a multiplicity of display elements.

FIG. 4 is a functional schematic of the invention in which the communicative display 10 has multiple individual elements therein. A single reference segment 11 is used as comparison to the communicative display 10 by the detector circuit 14 via the multiplexing operation 44. The detector circuit 14 communicates to the reference 11 and to the communicative display 10 the appropriate signals to afffectuate multiplexing.

The multiplexing operation 44 is performed in a column multiplex scheme 42 and a row multiplex scheme 43. The row multiplex scheme 43 communicates via bus 46 to the individual elements, such as 45. A control means 41 communicates with the detector circuit 14, so that when the operator comes in proximity to the display elements 10, this proximity is determined by the detector circuit 14 and communicated to the control means 21. The control means 41, upon the proximity of the operator, communicates to the slave device 15 the change in state so that the operation of the slave device 15 is appropriately altered.

Note that in this embodiment a multiplicity of elements, such as 45, may be formed which utilize a single reference element 11. In this fashion, it is not essential to retain a one-to-one relationship between the display element 45 and the reference element 11; but, a multiple arrangement of elements to a single reference element is utilized. Typically, this type of formation would be used to form a symbol characteristic of the information to be communicated to the operator, such as used in electronic watches.

Figure 5:
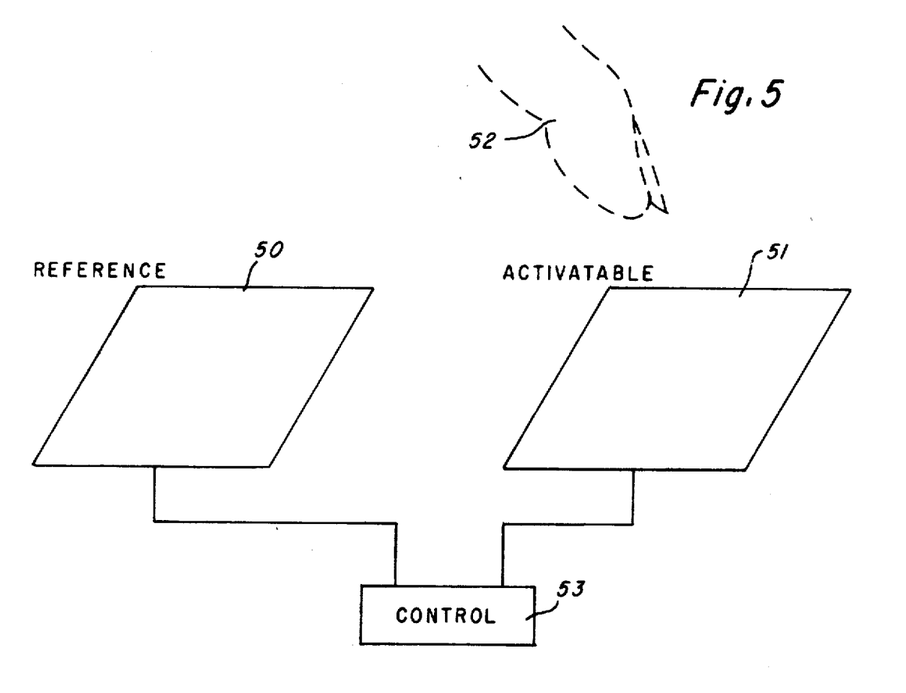
FIG. 5 illustrates an embodiment of the invention wherein the electrodes which are monitored by the control means are floating.

FIG. 5 illustrates an embodiment of the invention in which a single floating reference and a single floating activatable electrode are utilized as elements. The reference electrode 50, which is transparent, and the activatable electrode 51, also which is transparent, are in floating relationship; that is, a single lead communicates to each of them. The control means 53 will monitor the capacitance and inductance of each of the electrodes. As the operator 52 comes into the proximity of the activatible electrode 51, the capacitance and the inductance thereof will be altered so that the control means 53 may determine the proximity of the operator 52.

Hence, a transparent electrode may be placed over an existing display so that, to the operator, it will appear that his proximity to the display causes a change of state. This embodiment is particularly susceptable in utilization in conjunction with a display element which does not have built therein an electrode which is capacitively couplable to an operator. One such display, but others exist, is a Light Emitting Diode (LED). LEDs are particularly useful as an active display in that they are operable in a dim or dark environment.

Figure 6:
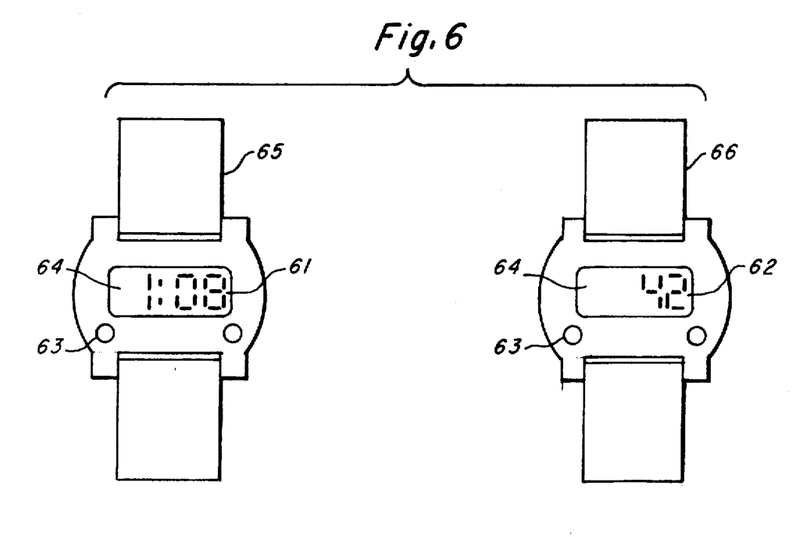
FIG. 6 illustrates the invention embodied in a digital watch.

FIG. 6 illustrates the invention being utilized in the operation of a digital watch. A digital watch has a display window 64 on which the informational content is communicated to the operator. In the situation of watch 65, the information 61 within the window 64 is the hour and minutes. Should the operator want to view the seconds, he passes his finger in proximity to the display window 64 thereby effectively changing the display window to that illustrated in watch 66. At that time, the display window 64 alters to illustrate the seconds, 62.

A reference element is positionable anywhere on the watch, whether visible or not visible to the operator. In this embodiment. FIG. 6, the reference element is illustrated as 63. The only criteria which should be maintained to reduce the amount of noise to the controller, not shown here, is that the reference element 63 and the display elements 64, are subjected to the same environmental conditions so that they respond in similar or like fashion.

This invention allows a display to perform both a communicating function from the instrument to the operator and additionally, from the operator to the instrument. Hence, the number of components and the number of interconnects which must be developed and designed is significantly reduced, allowing for a much simpler and less complex device to be made. Additionally, the need for moving parts necessary for mechanical switches or other such switching means is completely aleviated allowing the device to be sealed so that contaminants are effectively eliminated from the electronic components held within the device. Important to note is that the operator never has to come in contact with the display itself, but may only come in to some proximity thereto.

What is claimed is:

1. A device having at least two states comprising:
   a. a reference element;
   b. an active element having alterable electrical characteristics responsive to the proximity of an operator; and
   c. means for,
      (i) driving said reference element and said active element at a chosen level and producing signals therefrom, and for,
      (ii) comparing the signal from said reference element and the signal from said active element and generating a comparison signal therefrom, and for,
      (iii) altering the state of said device reponsive to said comparison signal.

2. The device according to claim 1, wherein said means for altering the state is further comprised of altering the state only if the comparison signal exceeds a selected threshold level.

3. The device according to claim 2, further comprised of a slaved unit whose operation is directed by said means for altering states.

4. The device according to claim 3, wherein said reference element and said active element is comprised of at least one liquid crystal display.

5. An operator interface comprising:
   a. a reference element;
   b. an active element having alterable electrical characteristics responsive to the proximity of an operator; and
   c. control means having at least two states and having,
      (i) means for supplying a preselected signal to said reference element and generating a signal therefrom,
      (ii) means for supplying a chosen signal to said active element and generating a signal therefrom,
      (iii) means for comparing the signal from said reference element to the signal from said active element, and generating a comparison signal, and
      (iv) means for altering the state of said control means according to said comparison signal.

6. The operator interface according to claim 5, wherein said means for altering is further comprised of a theshold level to which the comparison signal is compared.

7. The operator interface according to claim 6, wherein the reference element and said active element are comprised of at least one liquid crystal display.

8. An interactive system comprised of:
   a. the operator interface according to claim 6; and,
   b. at least one slaved unit coupled to said control means and operating according to the state of said control means.

9. The interactive system according to claim 8, wherein said slaved unit is a watch.

10. The interactive system according to claim 8, wherein said slaved unit is a mechanical apparatus.

11. The interactive system according to claim 10, wherein said mechanical apparatus is an automatic transmission of an automobile.

12. A method of operating an operator interface having at least two states, comprising the steps of:
   a. driving a reference element at a chosen level;
   b. driving a display element having alterable electrical characteristics according to the proximity of an operator;
   c. comparing signals from said reference element and said display element and generating a comparison signal therefrom; and,
   d. altering states of said operator interface according to said comparison signal.

13. The method of operating an operator interface according to claim 12, further comprising the step of altering the operation of a slaved unit according to the state of said operator interface.

14. The method of operating an operator interface according to claim 13, wherein the step of altering states is further comprised comparison signal exceeding a selected threshold as conditional to the altering of states of said operator interface.

15. A proximity switch having at least two states comprised of:
   a. a first segment;
   b. a second segment having alterable electrical characteristics responsive to the proximity of an operator; and
   c. means for,
      (i) driving said first segment and said second segment at a selected level and generating signals therefrom, and for,
      (iii) altering the state of said proximity switch according to difference between the signal of said first element and the signal of said second element.

16. The proximity switch according to claim 15, wherein the altering of the state of the proximity switch occurs only if the difference of the signal of the first segment and the signal of the second segment exceeds a selected threshold.

17. The proximity switch according to claim 16, wherein said first and said second segment are comprised of liquid crystal cells.

* * * * *